(12) United States Patent
Huang

(10) Patent No.: US 12,388,436 B2
(45) Date of Patent: Aug. 12, 2025

(54) DRIVE CIRCUIT OF ELECTROSTATIC FILM ACTUATOR

(71) Applicant: ASUSTEK COMPUTER INC., Taipei (TW)

(72) Inventor: Lai-Shi Huang, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 245 days.

(21) Appl. No.: 18/304,734

(22) Filed: Apr. 21, 2023

(65) Prior Publication Data

US 2024/0267040 A1 Aug. 8, 2024

(30) Foreign Application Priority Data

Feb. 7, 2023 (TW) ................................. 112104182

(51) Int. Cl.
*H03K 17/10* (2006.01)
*H02N 1/00* (2006.01)
*H03K 17/0814* (2006.01)
*H04R 19/01* (2006.01)

(52) U.S. Cl.
CPC ............ *H03K 17/10* (2013.01); *H02N 1/006* (2013.01); *H03K 17/0814* (2013.01); *H04R 19/013* (2013.01); *H04R 2499/11* (2013.01)

(58) Field of Classification Search
CPC .. H04R 19/013; H04R 19/02; H04R 2499/11; H03K 17/10; H03K 17/0814; H02N 1/006

USPC ........................................................ 381/116
See application file for complete search history.

(56) References Cited

U.S. PATENT DOCUMENTS

| | | | | |
|---|---|---|---|---|
| 3,544,733 | A * | 12/1970 | Reylek | H04R 19/02 369/150 |
| 7,158,646 | B2 * | 1/2007 | Bank | H04R 3/00 330/199 |
| 2008/0204379 | A1 * | 8/2008 | Perez-Noguera | H04R 19/013 345/80 |
| 2010/0164324 | A1 * | 7/2010 | Kim | H10N 30/802 310/318 |

FOREIGN PATENT DOCUMENTS

| | | |
|---|---|---|
| CN | 1280988 C | 10/2006 |
| CN | 204167895 U | 2/2015 |
| CN | 208272853 U | 12/2018 |
| CN | 110719023 A | 1/2020 |

* cited by examiner

*Primary Examiner* — Burton S Mullins
(74) *Attorney, Agent, or Firm* — MUNCY, GEISSLER, OLDS & LOWE, P.C.

(57) ABSTRACT

A drive circuit is provided, which is used for driving an electrostatic film actuator. The drive circuit includes an input end, an isolation capacitor and a diode. The input end is used for receiving an input signal. The isolation capacitor includes a first end and a second end. The first end is electrically connected to the input end, and the second end is electrically connected to the electrostatic film actuator. The diode is connected between a working voltage end and the second end in a forward-bias direction, and an output signal is generated at the second end to drive the electrostatic film actuator.

8 Claims, 5 Drawing Sheets

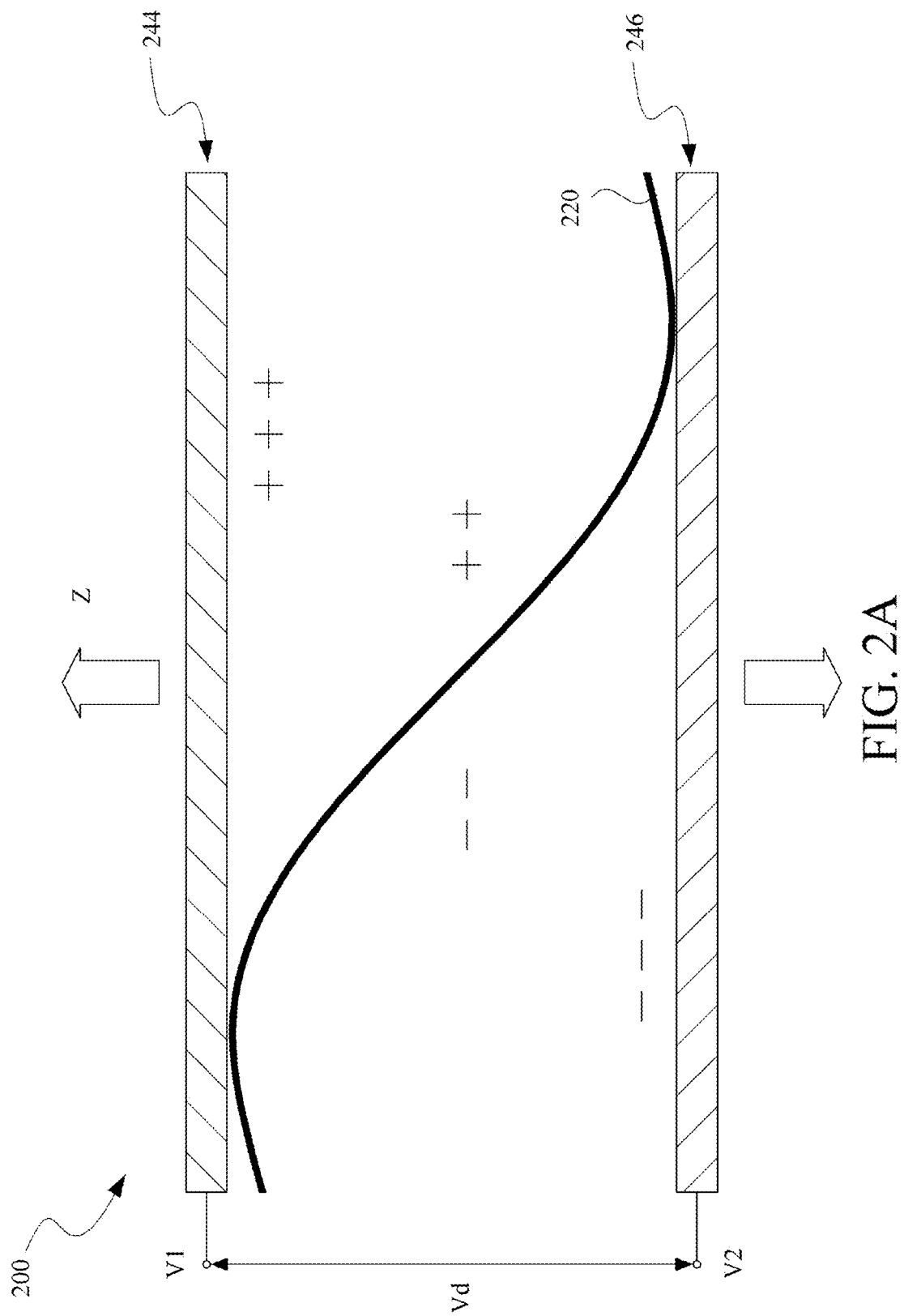

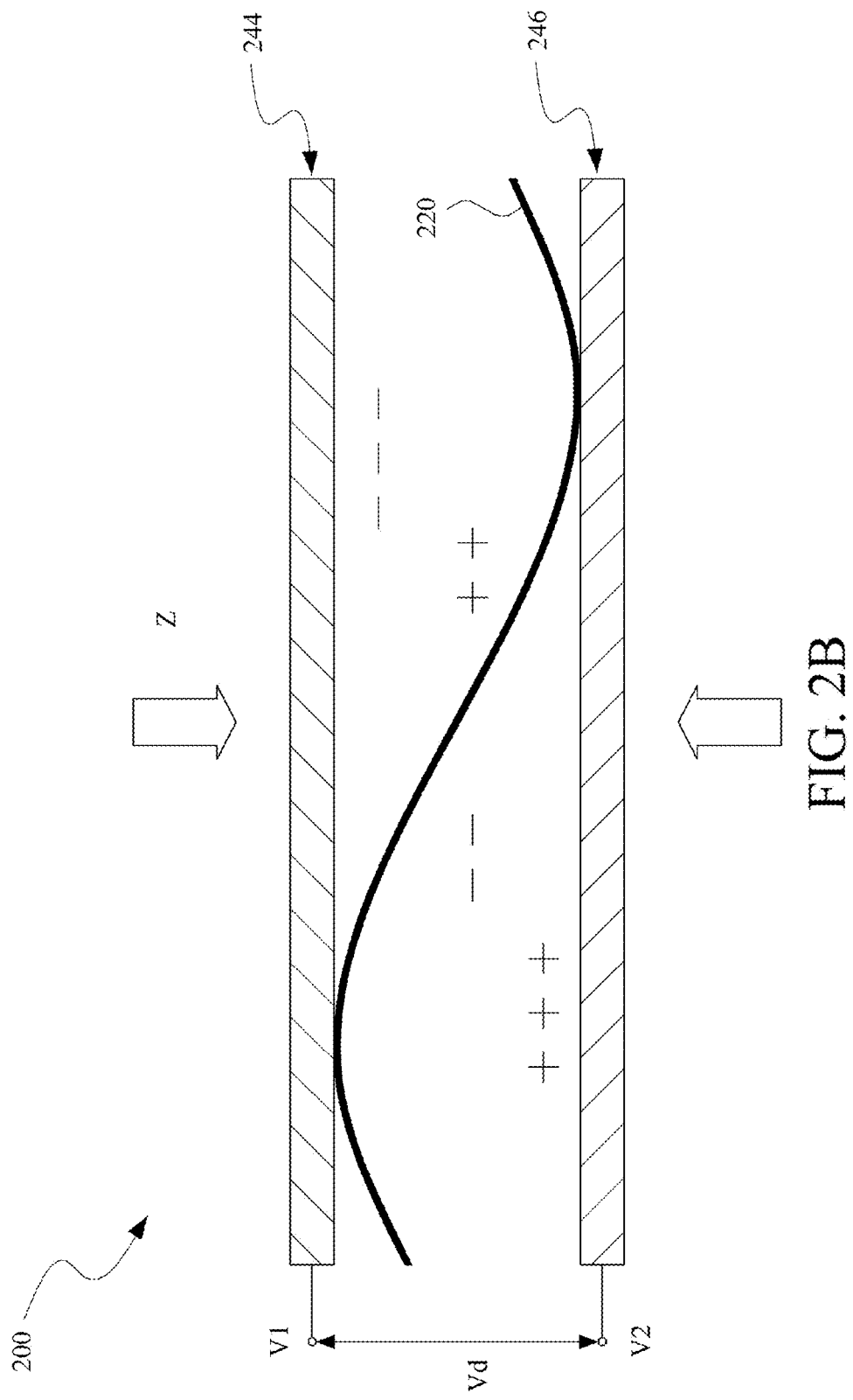

DRIVE CIRCUIT OF ELECTROSTATIC FILM ACTUATOR

CROSS-REFERENCE TO RELATED APPLICATION

This application claims the priority benefit of Taiwan application Ser. No. 112104182, filed on Feb. 7, 2023. The entirety of the above-mentioned patent application is hereby incorporated by reference herein and made a part of the specification.

BACKGROUND OF THE INVENTION

Field of the Invention

The disclosure relates to a drive circuit, and more particularly, to a drive circuit for an electrostatic film actuator.

Description of the Related Art

Actuators are devices that convert energy into mechanical kinetic energy, to drive an object to perform various predetermined actions. Among these actuators, an electrostatic film actuator has advantages of simple structure and easy driving. However, an electrostatic force is inversely proportional to the square of a distance. In order to generate a sufficient drive distance, it is often necessary to apply an extremely high drive voltage, so that it is hard to apply the electrostatic film actuator to general electronic products.

BRIEF SUMMARY OF THE INVENTION

The disclosure provides a drive circuit, which is used for driving an electrostatic film actuator. The drive circuit includes an input end, an isolation capacitor and a diode. The input end is used for receiving an input signal. The isolation capacitor includes a first end and a second end. The first end is electrically connected to the input end, and the second end is electrically connected to the electrostatic film actuator. The diode is connected between a working voltage end and the second end in a forward-bias direction, and an output signal is generated at the second end to drive the electrostatic film actuator.

The disclosure further provides another drive circuit, which is used for driving an electrostatic film actuator. The electrostatic film actuator includes a positive electrode end and a negative electrode end. The drive circuit includes a first input end, a second input end, a first isolation capacitor, a second isolation capacitor, a first diode and a second diode. The first input end is used for receiving a first input signal. The second input end is used for receiving a second input signal.

The first isolation capacitor includes a first end and a second end. The first end is electrically connected to the first input end, and the second end is electrically connected to the positive electrode end. The first isolation capacitor includes a third end and a fourth end. The third end is electrically connected to the second input end, and the fourth end is electrically connected to the negative electrode end.

The first diode is connected between a first working voltage end and the second end in a forward-bias direction, and a first output signal is generated at the second end to drive the electrostatic film actuator. The second diode is connected between the fourth end and a second working voltage end in a forward-bias direction, and a second output signal is generated at the fourth end to drive the electrostatic film actuator.

By using the drive circuit provided in the disclosure, an electric potential of an input signal can be converted into an output signal by an isolation capacitor, and the output signal is transmitted to the electrostatic film actuator. An electric potential of the output signal is increased by a working voltage end and a diode, to drive the electrostatic film actuator.

BRIEF DESCRIPTION OF THE DRAWINGS

FIG. 2A and FIG. 2B show an embodiment of an electrostatic film actuator driven by the drive circuit of FIG. 1;

DETAILED DESCRIPTION OF THE EMBODIMENTS

Specific embodiments of the disclosure will be described in more details below in combination with the schematic diagrams. Advantages and features of the disclosure will become clearer from the following descriptions and claims. It should be noted that the drawings are in extremely simple form and non-precise proportions and are presented for convenience and clarity only to assist in describing the embodiments of the disclosure.

Figure 1:
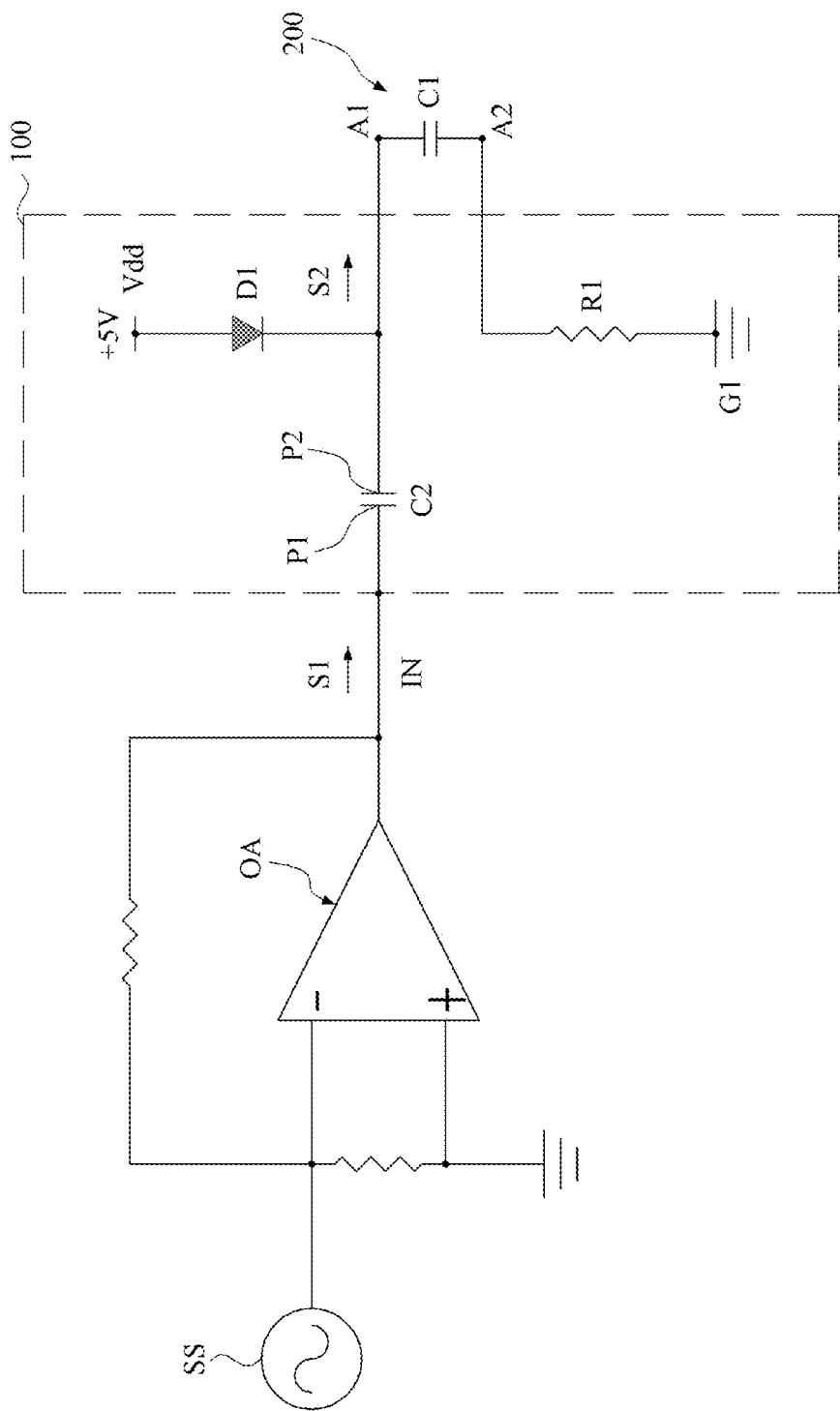
FIG. 1 is a circuit diagram of a drive circuit provided according to one embodiment of the disclosure.

FIG. 1 is a circuit diagram of a drive circuit 100 provided according to one embodiment of the disclosure. The drive circuit 100 is used for driving an electrostatic film actuator 200. Electrically speaking, the electrostatic film actuator 200 is equivalent to a capacitor C1, which includes a positive electrode end A1 and a negative electrode end A2. A structure of the electrostatic film actuator 200 will be described in more detail in subsequent paragraphs corresponding to FIG. 2A and FIG. 2B.

As shown in the figure, the drive circuit 100 includes an input end IN, an isolation capacitor C2 and a diode D1. The input end IN is used for receiving an input signal S1. The input signal S1 is from an output end of an operational amplifier OA. A negative input end of the operational amplifier OA is connected to a signal source SS, and a positive input end of the operational amplifier OA is grounded. The operational amplifier OA serving as a stable voltage source generates the input signal S1 provided to the drive circuit 100 of the disclosure.

The isolation capacitor C2 includes a first end P1 and a second end P2. The first end P1 is electrically connected to the input end IN, and the second end P2 is electrically connected to the positive electrode end A1 of the electrostatic film actuator 200. The diode D1 is connected between a working voltage end Vdd and the second end P2 in a forward-bias direction, allowing a current to flow from the working voltage end Vdd to the second end P2, and an output signal S2 is generated at the second end P2 to drive the electrostatic film actuator 200.

In one embodiment, the input signal S1 is a first pulse width modulation signal. The isolation capacitor C2, the diode D1, the working voltage end Vdd and a capacitor C1 equivalent to the electrostatic film actuator 200 in the drive circuit 100 constitute a booster circuit, and a second pulse width modulation signal (namely, the output signal S2) is generated at the second end P2. A maximum voltage value of the second pulse width modulation signal is twice a voltage value of the working voltage end Vdd.

In one embodiment, the first pulse width modulation signal has a frequency range of 0.1 Hz to 192 kHz, and the generated second pulse width modulation signal has an operating range of 0.1 Hz to 96 kHz, which facilitates driving an electrostatic film speaker.

In one embodiment, the drive circuit 100 further includes a protection resistor R1. The protection resistor R1 is electrically connected between the negative electrode end A2 of the electrostatic film actuator 200 and a ground terminal G1, to prevent an excessive current from being generated to damage the electrostatic film actuator 200.

In one embodiment, in order to ensure that the maximum voltage value of the second pulse width modulation signal (namely, the output signal S2) generated at the second end P2 is large enough to drive the electrostatic film actuator 200.

FIG. 2A and FIG. 2B show an embodiment of an electrostatic film actuator 200 driven by the drive circuit 100 of FIG. 1.

As shown in the figures, the electrostatic film actuator 200 includes a first conductive layer 244, a second conductive layer 246, and an electret film layer 220. The first conductive layer 244 and the second conductive layer 246 are of plate-like structures and are electrically connected to a first voltage end V1 and a second voltage end V2 respectively, to receive a drive voltage Vd. The drive voltage Vd corresponds to the output signal S2 in FIG. 1.

The electret film layer 220 is located between first conductive layer 244 and second conductive layer 246. The electret film layer 220 is generally of a wave-like structure, wave crests of which abut against a lower surface of first conductive layer 244 located above the electret film layer, and wave troughs of which abut against an upper surface of the second conductive layer 246 located below the electret film layer.

The electret film layer 220 has a preset electric field. A direction of the preset electric field is parallel to an actuation direction Z of the electrostatic film actuator 200. As shown in the figures, the direction of the preset electric field of the electret film layer 220 is downward. The electret film layer 220 is made of a deformable material including a high dielectric constant material such as polytetrafluoroethylene.

With regard to the electret film layer 220, the direction of its preset electric field of is downward, which means that positive charges are distributed on an upper surface of the electret film layer 220, and negative charges are distributed on a lower surface. As shown in FIG. 2A, if a positive voltage is applied between the first voltage end V1 and the second voltage end V2, positive charges are distributed on the first conductive layer 244 located above the electret film layer 220, and negative charges are distributed on the second conductive layer 246 located below the electret film layer 220.

At this time, since the first conductive layer 244 (having the positive charges) has the same electrical property as the upper surface (having the positive charges) of the electret film layer 220, a repulsive force is generated between the first conductive layer 244 and the electret film layer 220 below the first conductive layer.

Similarly, since the second conductive layer 246 (having the negative charges) has the same electrical property as the lower surface (having the negative charges) of the electret film layer 220, a repulsive force is also generated between the second conductive layer 246 and the electret film layer 220 above the second conductive layer. In this way, the electret film layer 220 deforms, and an overall length of the electrostatic film actuator 200 is increased.

As shown in FIG. 2B, if a negative voltage is applied between the first voltage end V1 and the second voltage end V2, negative charges are distributed on the first conductive layer 244, and positive charges are distributed on the second conductive layer 246. At this time, since the first conductive layer 244 (having the negative charges) has an opposite electrical property to the upper surface (having the positive charges) of the electret film layer 220, an attractive force is generated between the first conductive layer 244 and the electret film layer 220 below the first conductive layer.

Similarly, since the second conductive layer 246 (having the positive charges) has an opposite electrical property as the lower surface (having the negative charges) of the electret film layer 220, an attractive force is also generated between the second conductive layer 246 and the electret film layer 220 above the second conductive layer. In this way, the electret film layer 220 deforms, and an overall length of the electrostatic film actuator 200 is decreased.

The electrostatic film actuator 200 shown in FIG. 2A and FIG. 2B is intended to illustrate the electrostatic film actuator 200 that is driven by the drive circuit 100, and is not intended to limit the scope of the disclosure. The drive circuit 100 is applied to driving other different types of electrostatic film actuators or electrostatic film actuators with different structures.

Figure 3:
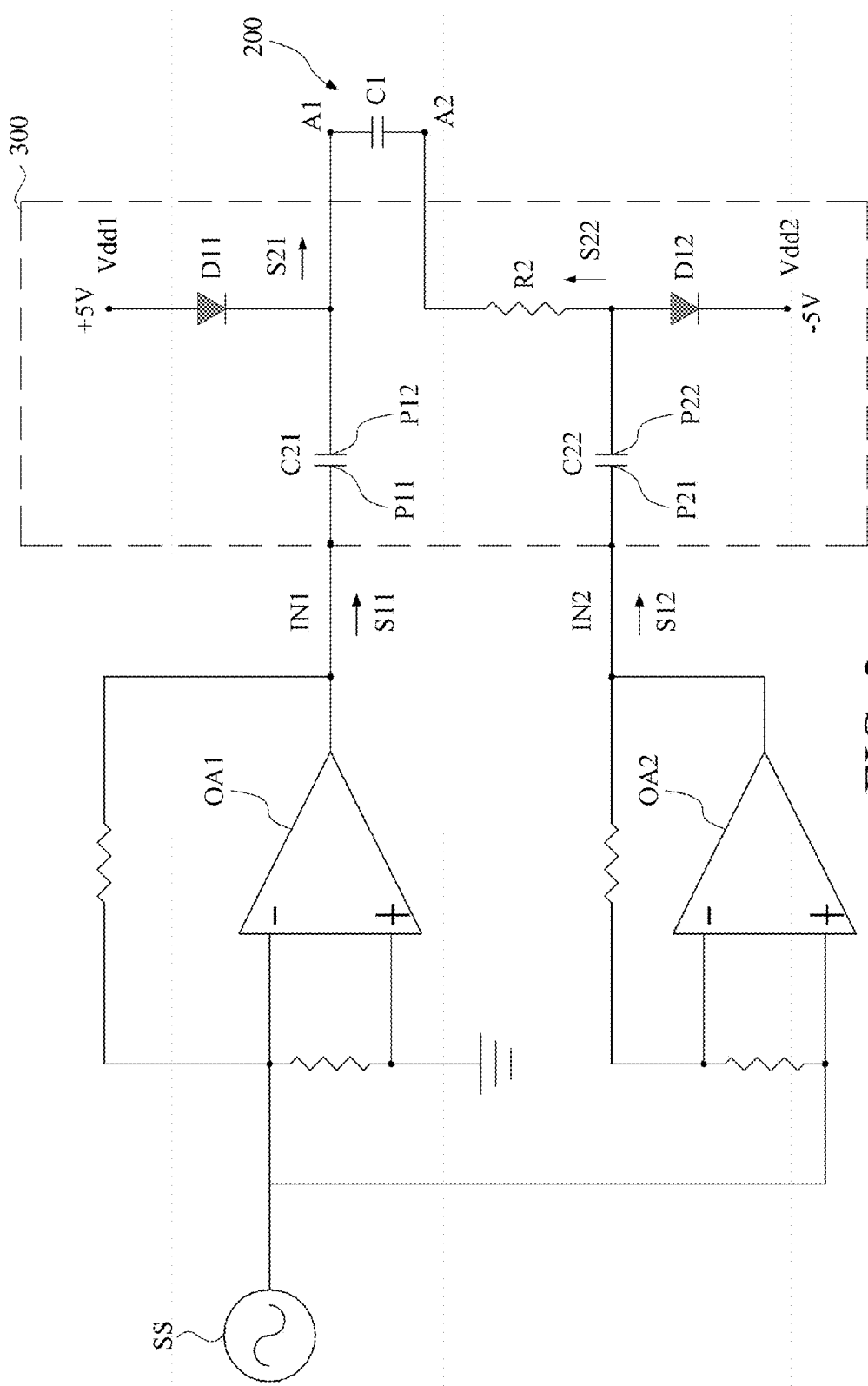
FIG. 3 is a circuit diagram of a drive circuit provided according to another embodiment of the disclosure.

FIG. 3 is a circuit diagram of a drive circuit 300 provided according to another embodiment of the disclosure. The drive circuit 300 is used for driving an electrostatic film actuator 200. Electrically speaking, the electrostatic film actuator 200 is equivalent to a capacitor C1, which includes a positive electrode end A1 and a negative electrode end A2.

As shown in the figures, the drive circuit 300 includes a first input end IN1, a second input end IN2, a first isolation capacitor C21, a second isolation capacitor C22, a first diode D11 and a second diode D12.

The first input end IN1 is used for receiving a first input signal S11. The second input end IN2 is used for receiving a second input signal S12. In one embodiment, the second input signal S12 is an inverted signal of the first input signal S11.

In this embodiment, the first input signal S11 is from an output end of an operational amplifier OA1. A negative input end of the operational amplifier OA1 is connected to a signal source SS, and a positive input end of the operational amplifier OA1 is grounded. The operational amplifier OA1 serving as a stable voltage source generates the input signal S11 provided to the drive circuit 300 of the disclosure.

The second input signal S12 is from an output end of another operational amplifier OA2. A positive input end of the operational amplifier OA2 is connected to the signal source SS. The operational amplifier OA2 serving as a stable voltage source generates an inverted signal (namely, the second input signal S12) of the first input signal S11 provided to the drive circuit 300 of the disclosure.

The first isolation capacitor C21 includes a first end P11 and a second end P12. The first end P11 is electrically connected to the first input end IN1, and the second end P12 is electrically connected to the positive electrode end A1. The second isolation capacitor C22 includes a third end P21 and a fourth end P22. The third end P21 is electrically connected to the second input end IN2, and the fourth end P22 is electrically connected to the negative electrode end A2.

The first diode D11 is connected between a first working voltage end Vdd1 and the second end P12 in a forward-bias direction, allowing a current to flow from the first working voltage end Vdd1 to the second end P12, and a first output signal S21 is generated at the second end P12 to drive the electrostatic film actuator 200.

The second diode D12 is connected between a second working voltage end Vdd2 and the fourth end P22 in a forward-bias direction, allowing a current to flow from the second working voltage end Vdd2 to the fourth end P22, and a second output signal S22 is generated at the fourth end P22 to drive the electrostatic film actuator 200.

In one embodiment, the first input signal S11 is a first pulse width modulation signal, and the second input signal S12 is an inverted signal of the first pulse width modulation signal. Voltages of the first working voltage end Vdd1 and the second working voltage end Vdd2 have opposite polarities, and absolute values of the voltages of the first working voltage end Vdd1 and the second working voltage end Vdd2 are the same.

In an embodiment, the first working voltage end Vdd1 is a positive voltage end providing a fixed voltage of +5 V, and the second working voltage end Vdd2 is a negative voltage end providing a fixed voltage of −5 V. However, the disclosure is not limited thereto.

The first isolation capacitor C21, the first diode D11, the first working voltage end Vdd1 and the capacitor C1 equivalent to the electrostatic film actuator 200 in the drive circuit 300 constitute a booster circuit, and a second pulse width modulation signal (namely, the first output signal S21) is generated at the second end P12. A maximum voltage value of the second pulse width modulation signal is greater than a maximum voltage value of the first pulse width modulation signal (namely, the first input signal S11) and is greater than a voltage value of the first working voltage end Vdd1.

The second isolation capacitor C22, the second diode D12, the second working voltage end Vdd2 and the capacitor C1 equivalent to the electrostatic film actuator 200 in the drive circuit 300 constitute another booster circuit, and a third pulse width modulation signal (namely, the second output signal S22) is generated at the fourth end P22. A minimum voltage value of the third pulse width modulation signal is less than a minimum voltage value of the inverted signal of the first pulse width modulation signal (namely, the first input signal S11) and is less than a voltage value of the second working voltage end Vdd2. That is, the drive circuit 300 of FIG. 3 is divided into two booster circuits to further increase the voltage (namely, a voltage difference between the second end P12 and the fourth end P22) that drives the electrostatic film actuator 200.

In one embodiment, in order to ensure that the maximum voltage value of the second pulse width modulation signal generated at the second end P12 is large enough to drive the electrostatic film actuator 200.

In one embodiment, the drive circuit 300 further includes a protection resistor R2. The protection resistor R2 is electrically connected between the negative electrode end A2 of the electrostatic film actuator 200 and the fourth end P22, to prevent an excessive current from being generated to damage the electrostatic film actuator 200. In other embodiments, the protection resistor R2 is electrically connected between the positive electrode end A1 of the electrostatic film actuator 200 and the second end P12.

Figure 4:
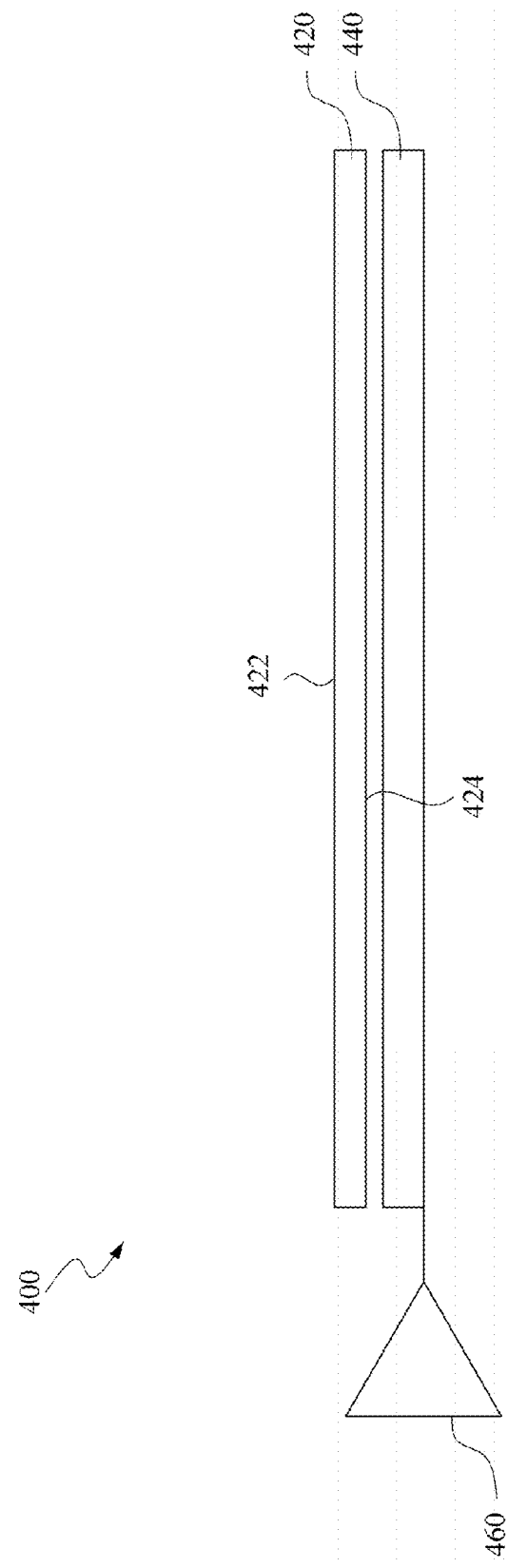
FIG. 4 is a schematic diagram of applying the drive circuit of the disclosure to a handheld electronic device to drive an electrostatic film actuator to make a sound.

FIG. 4 is a schematic diagram of applying the drive circuit of the disclosure to a handheld electronic device to drive an electrostatic film actuator to make a sound.

As shown in the figure, the handheld electronic device 400 includes a display panel 420, an electrostatic film actuator 440 and a drive circuit 460. The display panel 420 is a liquid crystal display panel, an organic light emitting diode display panel, an electronic paper panel, and the like. The electrostatic film actuator 440 is an electret film actuator driven by a coulomb force, such as the electrostatic film actuator 200 shown in FIG. 2A and FIG. 2B. The drive circuit 460 is the drive circuit shown in FIG. 1 or FIG. 3.

The display panel 420 includes a front side 422 and a rear side 424 which are opposite to each other. The electrostatic film actuator 440 is arranged at the rear side 424 of the display panel 420. The drive circuit 460 is electrically connected to the electrostatic film actuator 440 to drive the electrostatic film actuator 440 to generate motion, thereby driving the display panel 420 to generate vibrations and make a sound.

By using the drive circuits 100, 300, 460 provided in the disclosure, an electric potential of an input signal can be converted into an output signal by an isolation capacitor, and the output signal is transmitted to the electrostatic film actuators 200, 440. An electric potential of the output signal is increased by a working voltage end and a diode, to drive the electrostatic film actuators 200, 440.

The foregoing merely describes preferred embodiments of the disclosure and is not to limit the disclosure in any way. Any persons skilled in the art, without departing from the scope of the technical means of the disclosure, make any equivalent replacements or modification to the technical means and technical contents disclosed in the disclosure. The equivalent replacements or modifications are contents of the technical means of the disclosure and still fall within the scope of the disclosure.

What is claimed is:

1. A drive circuit, which is used for driving an electrostatic film actuator, the drive circuit comprising:
    an input end, used for receiving an input signal;
    an isolation capacitor, comprising a first end and a second end, wherein the first end is electrically connected to the input end, and the second end is electrically connected to the electrostatic film actuator; and
    a diode, connected between a working voltage end and the second end in a forward-bias direction, wherein an output signal is generated at the second end to drive the electrostatic film actuator,
    wherein the input signal is a first pulse width modulation signal, and
    wherein the first pulse width modulation signal has a frequency range of 0.1 Hz to 192 kHz; the output signal is a second pulse width modulation signal; and the second pulse width modulation signal has a frequency range of 0.1 Hz to 96 kHz.

2. The drive circuit according to claim 1, wherein the electrostatic film actuator is an electret film speaker.

3. The drive circuit according to claim 1, further comprising a protection resistor, electrically connected between the electrostatic film actuator and a ground terminal.

4. A drive circuit, which is used for driving an electrostatic film actuator comprising a positive electrode end and a negative electrode end, wherein the drive circuit comprises:
    a first input end, used for receiving a first input signal;
    a second input end, used for receiving a second input signal;

a first isolation capacitor, comprising a first end and a second end, wherein the first end is electrically connected to the first input end, and the second end is electrically connected to the positive electrode end;

a second isolation capacitor, comprising a third end and a fourth end, wherein the third end is electrically connected to the second input end, and the fourth end is electrically connected to the negative electrode end;

a first diode, connected between a first working voltage end and the second end in a forward-bias direction, wherein a first output signal is generated at the second end to drive the electrostatic film actuator; and a second diode, connected between the fourth end and a second working voltage end in a forward-bias direction, wherein a second output signal is generated at the fourth end to drive the electrostatic film actuator; and wherein the second input signal is an inverted signal of the first input signal.

5. The drive circuit according to claim 4, wherein the first input signal is a first pulse width modulation signal.

6. The drive circuit according to claim 4, wherein the electrostatic film actuator is an electret film speaker.

7. The drive circuit according to claim 4, wherein the first working voltage end is a positive voltage end, and the second working voltage end is a negative voltage end.

8. The drive circuit according to claim 4, further comprising a protection resistor, electrically connected between the negative electrode end and the fourth end.

\* \* \* \* \*